United States Patent
Cheng et al.

(10) Patent No.: US 10,910,604 B2
(45) Date of Patent: Feb. 2, 2021

(54) ORGANIC LIGHT-EMITTING DISPLAY PANEL, METHOD FOR ADJUSTING COLOR TEMPERATURE THEREOF, AND DISPLAY DEVICE

(71) Applicant: Shanghai Tianma AM-OLED Co., Ltd., Shanghai (CN)

(72) Inventors: Shuang Cheng, Shanghai (CN); Jinghua Niu, Shanghai (CN); Xiangcheng Wang, Shanghai (CN); Yuji Hamada, Shanghai (CN); Angran Zhang, Shanghai (CN); Run Yang, Shanghai (CN)

(73) Assignee: SHANGHAI TIANMA AM-OLED CO., LTD., Shanghai (CN)

( * ) Notice: Subject to any disclaimer, the term of this patent is extended or adjusted under 35 U.S.C. 154(b) by 25 days.

(21) Appl. No.: 15/912,252

(22) Filed: Mar. 5, 2018

(65) Prior Publication Data

US 2018/0198098 A1 Jul. 12, 2018

(30) Foreign Application Priority Data

Jul. 26, 2017 (CN) .......................... 2017 1 0619710

(51) Int. Cl.
| | | |
|---|---|---|
| *H01L 51/56* | (2006.01) | |
| *H01L 27/32* | (2006.01) | |
| *H01L 51/52* | (2006.01) | |
| *H01L 51/50* | (2006.01) | |

(52) U.S. Cl.
CPC ............ *H01L 51/56* (2013.01); *H01L 27/322* (2013.01); *H01L 27/3209* (2013.01); *H01L 51/504* (2013.01); *H01L 51/5218* (2013.01); *H01L 51/5234* (2013.01); *H01L 2251/5315* (2013.01)

(58) Field of Classification Search
None
See application file for complete search history.

(56) References Cited

U.S. PATENT DOCUMENTS

| | | | | |
|---|---|---|---|---|
| 6,528,188 B1 * | 3/2003 | Suzuki | ................ | H01L 51/5036 313/502 |
| 2014/0014933 A1 * | 1/2014 | Sasaki | ................ | H01L 51/5044 257/40 |

FOREIGN PATENT DOCUMENTS

| | | |
|---|---|---|
| CN | 101106180 A | 1/2008 |
| CN | 101371619 A | 2/2009 |
| CN | 101819989 A | 9/2010 |

(Continued)

*Primary Examiner* — Raj R Gupta
(74) *Attorney, Agent, or Firm* — Alston & Bird LLP (57) ABSTRACT

The disclosure discloses an organic light-emitting display panel, a method for adjusting color temperature thereof, and a display device, and the organic light-emitting display panel includes: an underlying substrate, and a plurality of light-emitting elements arranged on the underlying substrate; each of the light-emitting elements includes a first electrode, a first light-emitting layer, a second electrode, a second light-emitting layer, and a third electrode arranged on the underlying substrate in that order in a light exit direction of the organic light-emitting display panel, where a wavelength of emitted light from the first light-emitting layer is greater than a wavelength of emitted light from the second light-emitting layer; and the first electrode, the second electrode, and the third electrode are connected respectively with different voltage signal terminals.

5 Claims, 5 Drawing Sheets

(56) References Cited

FOREIGN PATENT DOCUMENTS

| | | |
|---|---|---|
| CN | 105723538 A | 6/2016 |
| EP | 2182563 A2 | 5/2010 |
| GB | 2443314 A | 4/2008 |
| JP | 2011113738 A | 6/2011 |

* cited by examiner

ORGANIC LIGHT-EMITTING DISPLAY PANEL, METHOD FOR ADJUSTING COLOR TEMPERATURE THEREOF, AND DISPLAY DEVICE

This application claims the benefit of Chinese Patent Application No. CN 201710619710.6, filed with the Chinese Patent Office on Jul. 26, 2017, which is hereby incorporated by reference in its entirety.

FIELD

The present disclosure relates to the field of display technologies, and particularly to an organic light-emitting display panel, a method for adjusting color temperature thereof, and a display device.

BACKGROUND

As the display technologies are developing rapidly, the users also have higher and higher requirements for the color display effect of the display device. An Organic Light-Emitting Diode (OLED) display device has been increasingly favored in the industry due to self-light-emission, a high contrast, a high response speed, a wide angle of view, and other excellent characteristics thereof as compared with a liquid crystal display device.

At present, there are the following several color display modes for the OLED display device. The first color display mode is a color mode in which sub-pixels in respective colors light emit separately, where pixels in three primary colors are arranged through vapor deposition using a fine metal mask, so there is a high cost, but it is also difficult to align the pixels with the mask, and to select the material of the mask. The second color display mode is a light-emission mode in which one color is converted into another, where light is emitted in respective colors using blue-light OLEDs together with an array of light color conversion films, but it is difficult to develop the light color conversion films in this light-emission mode. The third color display mode is a light-emission mode in which white light is emitted, and color filters are used, where like a liquid crystal display panel, white-light OLEDs operate as a backlight, and the white light is further filtered in respective colors by the color filters, so that a color image is displayed; and there is a much lower cost in this light-emission mode than the other two light-emission modes above. This light-emission mode is currently applicable to various OLED displays.

The white-light OLED display is typically manufactured in an integral structure, and after it is manufactured, the intensity of light emission from the respective pixels can only be controlled as a function of voltage applied across the light-emitting elements. Color temperature of the display panel needs to be adjusted for various scenarios in real applications to thereby improve the viewing experience. However, once the existing white-light OLED display is manufactured, it may be difficult to change the color temperature thereof, thus limiting the display panel to few application areas.

SUMMARY

Embodiments of the disclosure provide an organic light-emitting display panel, a method for adjusting color temperature thereof, and a display device so as to adjust the color temperature of the organic light-emitting display panel.

In an aspect of the embodiments of the disclosure, there is provided an organic light-emitting display panel, where the organic light-emitting display panel includes: an underlying substrate, and a plurality of light-emitting elements arranged on the underlying substrate. Where each of the light-emitting elements includes a first electrode, a first light-emitting layer, a second electrode, a second light-emitting layer, and a third electrode arranged on the underlying substrate in that order in a light exit direction of the organic light-emitting display panel. A wavelength of emitted light from the first light-emitting layer is greater than a wavelength of emitted light from the second light-emitting layer; and the first electrode, the second electrode, and the third electrode are connected respectively with different voltage signal terminals.

In another aspect of the embodiments of the disclosure, there is provided a display device, which includes the organic light-emitting display panel above.

In still another aspect of the embodiments of the disclosure, there is provided a method for adjusting the color temperature of the organic light-emitting display panel above, where the method includes: adjusting potentials of the first electrode, the second electrode, and the third electrode according to color temperature as currently required of the organic light-emitting display panel to control the voltage applied across the first light-emitting layer and the voltage applied across the second light-emitting layer respectively, so as to control intensity of emitted light from the first light-emitting layer and the second light-emitting layer respectively, thus making the color temperature of the organic light-emitting display panel satisfactory.

DETAILED DESCRIPTION OF THE EMBODIMENTS

Embodiments of the disclosure provide an organic light-emitting display panel, a method for adjusting color temperature thereof, and a display device so as to adjust the color temperature of the organic light-emitting display panel.

In order to make the objects, features, and advantages above of the disclosure more apparent and easily understood, the disclosure will be further described below with reference to the drawings and the embodiments thereof. However the disclosure can be embodied in various forms, and shall not be construed as being limited to the exemplary embodiments described here. On the contrary, these embodiments are provided to make the disclosure more comprehensive and complete, and to convey the idea of the exemplary embodiments fully to those skilled in the art. The same reference numerals in the drawings represent the same or similar components, so a repeated description thereof will be omitted here. All the words as referred to in the disclosure to represent positions and directions will be described with reference to the drawings by way of an example, but can also be modified as needed, and all the modifications thereto shall fall into the scope of the disclosure as claimed. The drawings of the disclosure are merely intended to illustrate relative positional relationships, and the thickness of some components has been exaggerated for the sake of convenient understanding, but the thickness in the drawings may not represent any proportional relationship between the thickness in the drawings, and the actual thickness.

It shall be noted that specific details will be set forth in the following description to facilitate thorough understanding of the disclosure. However the disclosure can be embodied in various different embodiments from those described here, and those skilled in the art can generalize the embodiments similarly without departing from the spirit of the disclosure. Accordingly, the disclosure will not be limited to the specific embodiments to be disclosed below. For example, if one component is located on "a side" of another component as referred to throughout the description and the claims, then the component may or may not be adjacent to the other component. For another example, if one component is located on "a side" away from another component as referred to throughout the description and the claims, then the component may or may not be adjacent to the other component. The embodiments to be described below are preferable embodiments of the disclosure, and they are merely intended to set forth a general principle of the disclosure, but not to limit the scope of the disclosure. The scope of the disclosure as claimed shall be as defined in the appended claims.

The organic light-emitting display panel, the method for adjusting color temperature thereof, and the display device according to the embodiments of the disclosure will be described below in detail with reference to the drawings in which the thicknesses and shapes are not intended to reflect any real proportion of the display device, but merely intended to illustrate the disclosure.

Figure 1A:
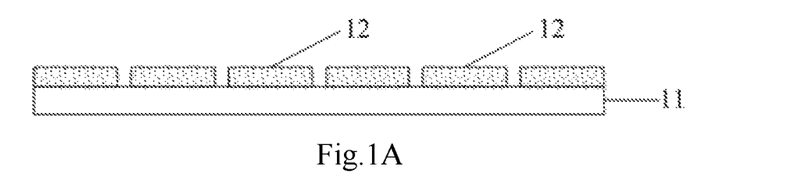
FIG. 1A is a schematic structural diagram of an organic light-emitting display panel according to an embodiment of the disclosure.

FIG. 1A is the first schematic structural diagram of an organic light-emitting display panel according to an embodiment of the disclosure, and as illustrated in FIG. 1A, the organic light-emitting display panel according to the embodiment of the disclosure includes an underlying substrate 11, and a plurality of light-emitting elements 12 arranged on the underlying substrate 11.

Figure 1B:
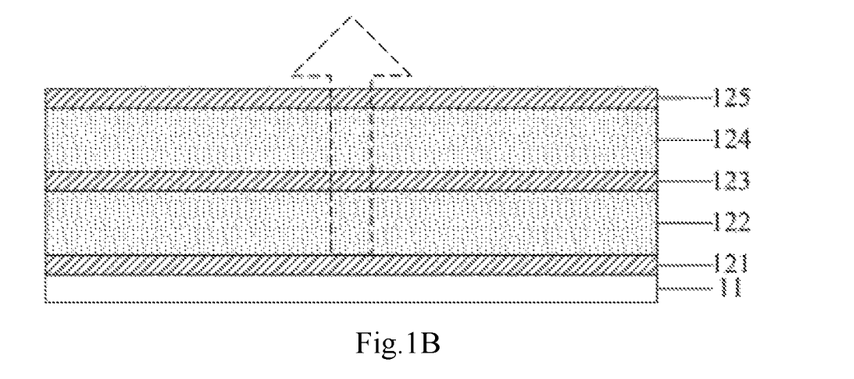
FIG. 1B is the first schematic structural diagram of a light-emitting element according to an embodiment of the disclosure.

Furthermore, FIG. 1B illustrates the first schematic structural diagram of each light-emitting element, and as illustrated in FIG. 1B, each of the light-emitting elements 12 may include a first electrode 121, a first light-emitting layer 122, a second electrode 123, a second light-emitting layer 124, and a third electrode 125 arranged on the underlying substrate 11, in that order, in a light exit direction of the organic light-emitting display panel, where a wavelength of emitted light from the first light-emitting layer 122 is greater than a wavelength of emitted light from the second light-emitting layer 124; and the first electrode 121, the second electrode 123, and the third electrode 125 are connected respectively with different voltage signal terminals.

In the embodiment of the disclosure, the two light-emitting layers with different wavelengths of emitted light are arranged in a stack, so that their emitted light is mixed into resultant exiting white light. In order to avoid the second light-emitting layer 124 from being irradiated by the emitted light from the first light-emitting layer 122, which would otherwise result in unnecessary stimulated light-emission, etc., the wavelength of emitted light from the first light-emitting layer 122 may be set greater than the wavelength of emitted light from the second light-emitting layer 124, and since energy of emitted light from the first light-emitting layer 122 is less than energy of emitted light from the second light-emitting layer 124, the problem above of stimulated light-emission will not occur. The first electrode 121, the second electrode 123, and the third electrode 125 are arranged respectively between, and on both sides of, the two light-emitting layers, and connected respectively with the different voltage signal terminals, so voltage signals may be applied separately to the respective electrodes, so that the voltage applied across the first light-emitting layer 122, and the voltage applied across the second light-emitting layer 124 may be controlled separately, and thus when intensity of emitted light from the two light-emitting layers are controlled to be varied, proportions of the intensity of the light at the two wavelengths among the resultant exiting light into which the light is mixed may be varied for the purpose of adjusting the color temperature.

Figure 1C:
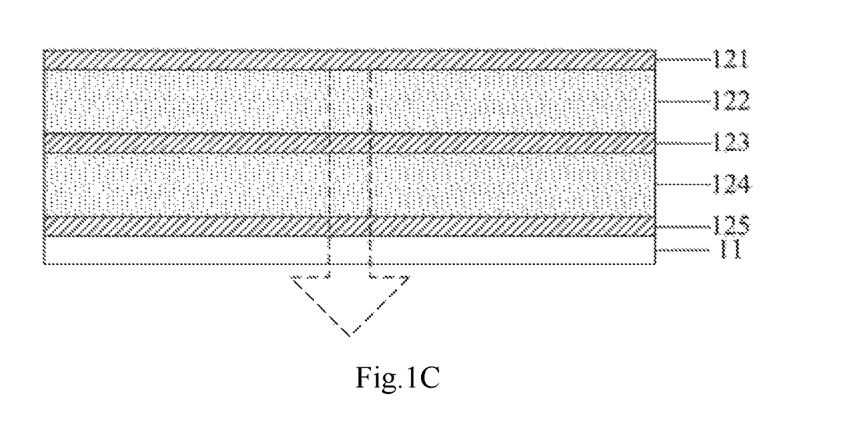
FIG. 1C is the second schematic structural diagram of a light-emitting element according to an embodiment of the disclosure; p

In a real application, the light-emitting element may be arranged as a top-emitting or bottom-emitting light-emitting element. When the light-emitting element is a top-emitting light-emitting element, it is structured as illustrated in FIG. 1B, and if the direction in which the vertically upward arrow points in FIG. 1B represents the emission direction of light rays, then the first electrode 121, the first light-emitting layer 122, the second electrode 123, the second light-emitting layer 124, and the third electrode 125 above will be arranged in that order from the bottom to the top, where the first electrode 121 is adjacent to the underlying substrate 11, and the first electrode 121 may be arranged as a total reflection electrode, so that the light rays emitted downward from the light-emitting element are finally emitted upward after being reflected by the first electrode 121. The second electrode 123 and the third electrode 125 may be arranged as semi-transmitting electrodes, so that the emitted light rays from the two light-emitting layers may exit upward. Alike when the light-emitting element is a bottom-emitting light-emitting element, it is structured as illustrated in FIG. 1C, and if the direction in which the vertically downward arrow points in FIG. 1C represents the emission direction of light rays, then the first electrode 121, the first light-emitting layer 122, the second electrode 123, the second light-emitting layer 124, and the third electrode 125 above will be arranged in that order from the top to the bottom, where the third electrode 125 is adjacent to the underlying substrate 11, and the first electrode 121 may be arranged as a total reflection electrode, so that the light rays emitted upward from the light-emitting element are finally emitted downward after being reflected by the first electrode 121. The second electrode 123 and the third electrode 125 may be arranged as semi-transmitting electrodes, so that the emitted light rays from the two light-emitting layers may exit downward. In a specific implementation, either of the two types of light-emitting elements above may be applied as needed in reality, although the embodiment of the disclosure will not be limited thereto.

Furthermore in the organic light-emitting display panel above, according to the embodiment of the disclosure, in order to simplify control on potentials of the respective electrodes, the potential of the second electrode 123 may be set at a fixed potential, so that only the potentials of the first electrode 121 and the third electrode 125 will be controlled to thereby vary the voltage applied across the first light-emitting layer 122, and the voltage applied across the second light-emitting layer 124. In a real application, the second electrode 123 may be grounded directly so that the potential of the second electrode 123 is a ground potential. Of course, the potential of the second electrode 123 may alternatively be maintained at another fixed potential, although the embodiment of the disclosure will not be limited thereto.

In the organic light-emitting display panel above according to the embodiment of the disclosure, the light-emitting element may be an organic electroluminescent element which emits light under such a principle that electrodes provide electrons and holes. The electrons and the holes are transmitted to a light-emitting layer, and then recombined into excitons, and the excitons transition from an excited state to a ground state, so that photons are radiated. In order to improve the efficiency of light emission from the organic electroluminescent element, a buffer layer for injecting carriers may be added to the light-emitting element, and for a specific structure thereof, reference may be made to schematic structural diagrams of the light-emitting element illustrated in FIG. 2A to FIG. 2C.

Figure 2A:
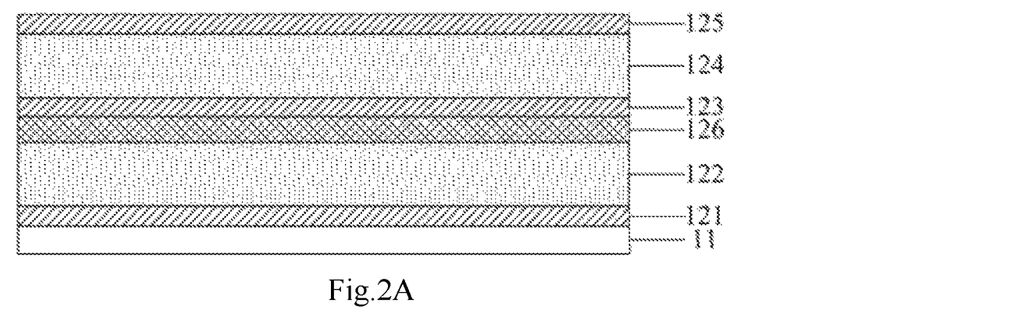
FIG. 2A is the third schematic structural diagram of a light-emitting element according to an embodiment of the disclosure.

In a possible implementation, as illustrated in FIG. 2A, the light-emitting element further includes a first buffer layer 126 arranged between the first light-emitting layer 122 and the second electrode 123 in addition to the structure illustrated in FIG. 1A above.

Figure 2B:
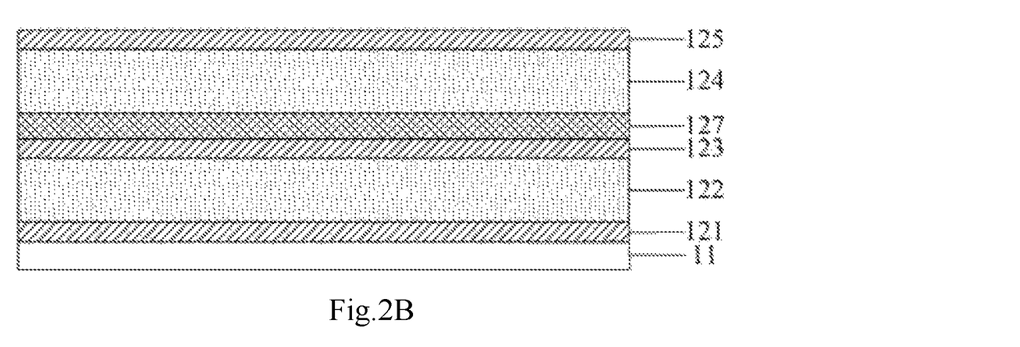
FIG. 2B is the fourth schematic structural diagram of a light-emitting element according to an embodiment of the disclosure.

Alternatively in another possible implementation, as illustrated in FIG. 2B, the light-emitting element further includes a second buffer layer 127 arranged between the second electrode 123 and the second light-emitting layer 124 in addition to the structure illustrated in FIG. 1A above.

Figure 2C:
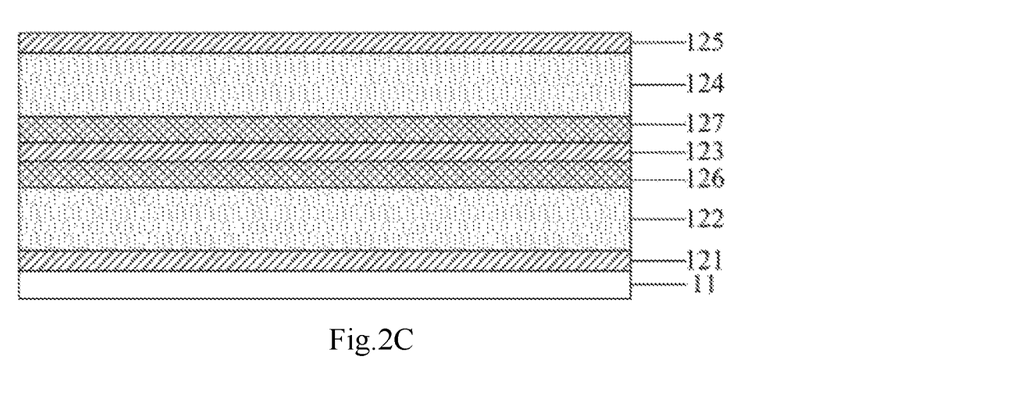
FIG. 2C is the fifth schematic structural diagram of a light-emitting element according to an embodiment of the disclosure.

In a real application, in a preferable implementation which is a combination of the two implementations above, as illustrated in FIG. 2C, the light-emitting element further includes a first buffer layer 126 arranged between the first light-emitting layer 122 and the second electrode 123, and a second buffer layer 127 arranged between the second electrode 123 and the second light-emitting layer 124 in addition to the structure illustrated in FIG. 1A above. The first buffer 126 and the second buffer 127 enable carriers (electrons or holes) in the electrodes to be injected into the light-emitting layers to thereby improve the efficiency of light emission from the light-emitting layers. In a specific implementation, the first buffer 126 and the second buffer 127 above may be an N-type buffer layer or a P-type buffer layer, respectively, dependent upon different setting of a direction of electric field, where a buffer layer for injecting electron carriers is referred to as an N-type buffer layer, and a buffer layer for injecting hole carriers is referred to as a P-type buffer layer. The first buffer 126 and the second buffer 127 may be arranged to improve a capability of the electrodes to inject the electrons or the holes into the light-emitting layers so as to improve the efficiency of light emission from the light-emitting layers.

The directions of the electric fields applied to the first light-emitting layer 122 and the second light-emitting layer 124 vary with the varying preset potentials of the first electrode 121, the second electrode 123, and the third electrode 125 above, so there are the following four instances of the types of carriers injected from the first buffer 126 and the second buffer 127 above.

In a possible implementation, if both the potentials of the first node 121 and the third electrode 125 are higher than the potential of the second electrode 123, that is, the direction of the electric field applied to the first light-emitting layer 122 is pointing from the first electrode 121 to the second electrode 123, and the direction of the electric field applied to the second light-emitting layer 124 is pointing from the third electrode 125 to the second electrode 123, then both the first electrode 121 and the third electrode 125 will be anodes, and the second electrode 123 will be a cathode for providing electrons, so both the first buffer 126 and the second buffer layer 127 above located on both the sides of the second electrode 123 will inject electrons, so both the first buffer 126 and the second buffer layer 127 are N-type buffer layers.

In this application scenario, the second electrode 123 may be made of a metal material with a low work function, for example, the material of the second electrode 123 may be any one of silver, titanium, an alloy of magnesium and silver, and an alloy of cerium and silver, and as an alternative to this, the material of the second electrode may be an alloy of zinc and silver, an alloy of calcium and silver, etc., or the second electrode 123 may be made of a compound material of the respective materials above, although the embodiment of the disclosure will not be limited thereto. At this time, the second electrode 123 may be fabricated as a semi-transparent electrode, and the third electrode 125 may be fabricated as a transparent electrode, thus improving the efficiency of light exiting.

In another possible implementation, if both the potentials of the first node 121 and the third electrode 125 are lower than the potential of the second electrode 123, that is, the direction of the electric field applied to the first light-emitting layer 122 is pointed from the second electrode 123 to the first electrode 121, and the direction of the electric field applied to the second light-emitting layer 124 is pointed from the second electrode 123 to the third electrode 125, then both the first electrode 121 and the third electrode 125 will be cathodes, and the second electrode 123 will be an anode for providing electrons, so both the first buffer 126 and the second buffer layer 127 above located on both the sides of the second electrode 123 will inject holes, so both the first buffer 126 and the second buffer layer 127 are P-type buffer layers.

In this application scenario, the second electrode 123 may be made of a metal material with a high work function, for example, the material of the second electrode 123 may be any one of silver, gold, copper, platinum, and an alloy of magnesium and silver, and as an alternative to this, the material of the second electrode may be an alloy of chromium and silver, an alloy of nickel and silver, palladium, etc., or the second electrode 123 may be made of a compound material of the respective materials above, although the embodiment of the disclosure will not be limited thereto. At this time, the second electrode 123 may be fabricated as a transparent electrode, the first electrode 121 may be fabricated as a total reflection electrode, and the third electrode 125 may be fabricated as a semi-reflecting electrode, thus improving the efficiency of light exiting.

In another possible implementation, if the potential of the first electrode 121 is higher than the potential of the second electrode 123, and the potential of the second electrode 123 is higher than the potential of the third electrode 125, that is, the direction of the electric field applied to the first light-emitting layer 122 is pointed from the first electrode 121 to the second electrode 123, and the direction of the electric field applied to the second light-emitting layer 124 is pointed from the second electrode 123 to the third electrode 125, then the first buffer layer 126 will inject electrons, and the second buffer 127 will inject holes, so the first buffer layer 126 is an N-type buffer layer, and the second buffer layer 127 is a P-type buffer.

In another possible implementation, if the potential of the first electrode 121 is lower than the potential of the second electrode 123, and the potential of the second electrode 123 is lower than the potential of the third electrode 125, that is, the direction of the electric field applied to the first light-emitting layer 122 is pointed from the second electrode 123 to the first electrode 121, and the direction of the electric field applied to the second light-emitting layer 124 is pointed from the third electrode 125 to the second electrode 123, then the first buffer layer 126 will inject holes, and the second buffer 127 will inject electrons, so the first buffer layer 126 is a P-type buffer layer, and the second buffer layer 127 is an N-type buffer.

Figure 3A:
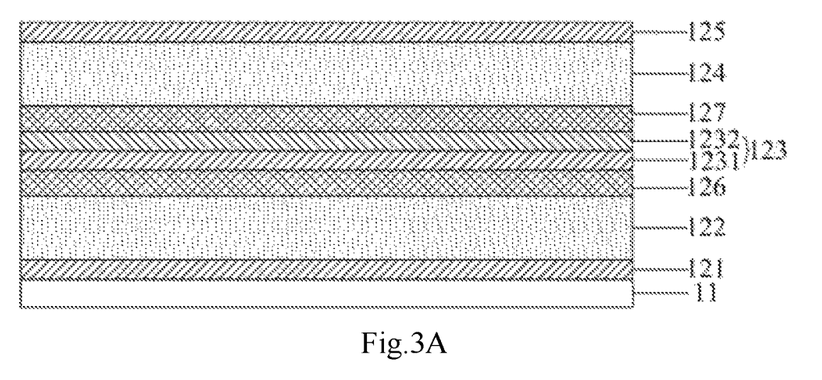
FIG. 3A is the sixth schematic structural diagram of a light-emitting element according to an embodiment of the disclosure.
Figure 3B:
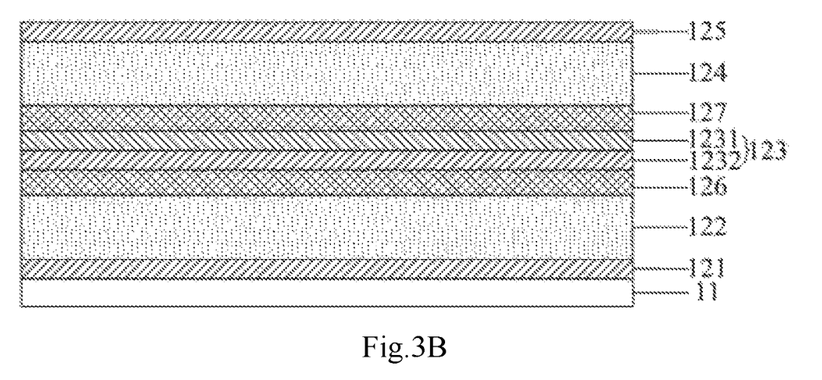
FIG. 3B is the seventh schematic structural diagram of a light-emitting element according to an embodiment of the disclosure.

In the latter two application scenarios above, since there are different types of buffer layers on both sides of the second electrode 123, in order to better match the capabilities of the buffer layers to inject carriers, the second electrode 123 is divided into two sub-electrodes arranged in a stack in the embodiment of the disclosure, as structurally illustrated in FIG. 3A and FIG. 3B. As illustrated in FIG. 3A which is a specific structural diagram of the light-emitting element in the third implementation above, the first buffer layer 126 is an N-type buffer layer, and the second buffer 127 is a P-type buffer layer; and at this time, the second electrode 123 includes a first sub-electrode 1231 and a second sub-electrode 1232 as illustrated in FIG. 3A, where the first sub-electrode 1231 is proximate to the N-type buffer layer (i.e., the first buffer layer 126), and the second sub-electrode 1232 is proximate to the P-type buffer layer (i.e., the second buffer layer 127). Alike as illustrated in FIG. 3B which is a specific structural diagram of the light-emitting element in the fourth implementation above, the first buffer layer 126 is a P-type buffer layer, and the second buffer 127 is an N-type buffer layer; and at this time, as illustrated in FIG. 3B, the first sub-electrode 1231 is proximate to the N-type buffer layer (i.e., the second buffer layer 127), and the second sub-electrode 1232 is proximate to the P-type buffer layer (i.e., the first buffer layer 126).

Since the types of the first buffer layer 126 and the second buffer layer 127 are different, the first sub-electrode 1231 and the second sub-electrode 1232 above will be made of materials matching with the types of the buffer layers. In a specific implementation, the first sub-electrode 1231 is proximate to the N-type buffer layer, and the second sub-electrode 1232 is proximate to the P-type buffer layer; and the N-type buffer layer is used for injecting electrons, and the P-type buffer layer is used for injecting holes, so the two layers of sub-electrodes will be made of such materials that there is a lower work function of the first sub-electrode 1231 than that of the second sub-electrode 1232, so that it is easier for the first sub-electrode 1231 proximate to the N-type buffer layer to provide electrons into the N-type buffer layer, and for the second sub-electrode 1232 proximate to the P-type buffer layer to provide holes into the P-type buffer layer, thus improving their capabilities to inject carriers so as to improve the efficiency of light emission. Given the precondition above, the material of the first sub-electrode 1231 may be silver, titanium, an alloy of magnesium and silver, an alloy of cerium and silver, an alloy of zinc and silver, an alloy of calcium and silver, etc.; and the material of the second sub-electrode 1232 may be silver, gold, copper, platinum, an alloy of magnesium and silver, an alloy of chromium and silver, an alloy of nickel and silver, palladium, etc., although the embodiment of the disclosure will not be limited thereto.

In a real application, in order for matching with the energy level of the electrode, the P-type buffer layer may be typically made of a material with a lower Lowest Unoccupied Molecular Orbital (LUMO), or the P-type buffer layer may be made of an insulation material, and the N-type buffer layer may be typically made in a thin film doped with a rare earth element, LiQ, Ca, etc., or the N-type buffer layer may be fabricated by doping an organic layer with the material above. Both the N-type buffer layer and the P-type buffer layer may be fabricated through thermal evaporation.

Furthermore both ranges of thicknesses of the N-type buffer layer and the P-type buffer layer may be set between 4 nm to 30 nm. If the N-type buffer layer primarily used for injecting electrons, and the P-type buffer layer primarily used for injecting holes, are too thick, then the carriers may be hindered from being transmitted, thus degrading the effect of injecting the carriers into the first light-emitting layer 122 and the second light-emitting layer 124. Accordingly, as demonstrated from a number of experiments made by the inventors, there is the better effect of injecting the carriers from the N-type buffer layer and the P-type buffer layer with their thicknesses set in the range of 4 nm to 30 nm.

Furthermore in order to improve the capabilities of the N-type buffer layer and the P-type buffer layer to transmit carriers to their corresponding light-emitting layers, at present a preferable material of the P-type buffer layer is a material with a low LUMO, and the energy level of the P-type buffer layer is controlled in the range of 5.0 eV<LUMO<5.6 eV, so that the P-type buffer layer may have a better conductivity of holes, and also the surface thereof may be machined in a simplified process; and the Highest Unoccupied Molecular Orbital (HUMO) of the N-type buffer layer may lie in the range of 1.5 eV<HUMO<3.0 eV. At the same time, the material of the second electrode 123 matching therewith may be a material with a work function ranging from 3.5 eV to 5.5 eV, thus improving the capability to inject carriers. At present, a preferable material of the N-type buffer layer may be an organic layer doped with a rare earth element, and they both offer a better effect of injecting and transmitting electrons, and higher thermal stability at an electron mobility thereof greater than $10^{-5}$ $cm^2V/s$.

In a specific implementation, in the organic light-emitting display panel of the top-emitting type as illustrated in FIG. 2C, for example, the emitted light from the first light-emitting layer 122 in the light-emitting element may be yellow or orange light; and the emitted light from the second light-emitting layer 124 may be blue light. The yellow (or orange) light emitted from the first light-emitting layer 122, and the blue light emitted from the second light-emitting layer 124 may be mixed into resultant exiting white light.

Figure 4:
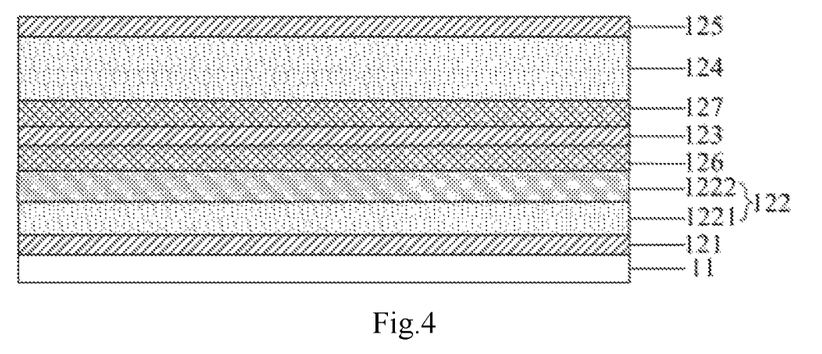
FIG. 4 is the eighth schematic structural diagram of a light-emitting element according to an embodiment of the disclosure.

In another possible implementation, as illustrated in FIG. 4 which is a schematic structural diagram of another light-emitting element according to an embodiment of the disclosure, the first light-emitting layer 122 in the light-emitting element may further include: a first light-emitting sub-layer 1221 and a second light-emitting sub-layer 1222 arranged in a stack on the first electrode 121 in the light exit direction of the organic light-emitting display panel, where a wavelength of emitted light from the first light-emitting sub-layer 1221 is greater than a wavelength of emitted light from the second light-emitting sub-layer 1222.

Furthermore the emitted light from the first light-emitting sub-layer 1221 may be red light, the emitted light from the second light-emitting sub-layer 1222 may be green light, and the emitted light from the second light-emitting layer 124 may be blue light. The red light emitted from the first light-emitting sub-layer 1221, the green light emitted light from the second light-emitting sub-layer 1222, and the blue light from the second light-emitting layer 124 may be mixed into resultant exiting white light.

In a real application, the light-emitting layers may be arranged as in either of the two implementations above, where the respective light-emitting layers above may be uni-doped, pre-doped, co-doped, etc. For example, the blue light-emitting layer may be doped with a fluorescent object of 0.5% to 5%, the yellow (or orange) light-emitting layer may be doped with a phosphor object of 2% to 8%, the red light-emitting sub-layer may be doped with a phosphor object of 2% to 8%, and the green light-emitting sub-layer may be doped with a phosphor object of 2% to 8%. They may alternatively be doped otherwise as needed in reality, although the embodiment of the disclosure will not be limited thereto.

Furthermore in the embodiment of the disclosure, the first light-emitting sub-layer 1221, the second light-emitting sub-layer 1222, and the second light-emitting layer 124 above may be structured in at least one layer, that is, there is at least one light-emitting layer between two adjacent electrodes; or the first light-emitting sub-layer 1221, the second light-emitting sub-layer 1222, and the second light-emitting layer 124 above may be structured in a stack, that is, each light-emitting layer includes a plurality of layers in a stack. In a specific application, the structures of the light-emitting layers may be arranged flexibly taking into account the overall thickness of the liquid display, and the efficiency of light emission from the light-emitting layers, although the embodiment of the disclosure will not be limited thereto.

Furthermore in the organic light-emitting display panel above according to the embodiment of the disclosure, the overall thickness of the light-emitting element is typically approximately 500 nm, so the thickness of the first light-emitting layer 122 above (or the sum thickness of the first light-emitting sub-layer 1221 and the second light-emitting sub-layer 1222) may be set in the range of 140 nm to 190 nm, and the thickness of the second light-emitting layer 124 may also be preset in the range of 140 nm to 190 nm, in the embodiment of the disclosure taking into account both the overall thickness and the efficiency of light emission, so that the overall thickness of the display panel will not be too large, and also high efficiency of light emission from each light-emitting layer may be ensured. As described above, the first electrode 121 is a total reflection electrode, the second electrode 123 and the third electrode 125 may be semi-transmitting electrodes, and the first electrode 121 may be made of a metal material into an all-metal electrode with a high reflectivity; or the first electrode 121 may be made of metal oxide overlying metal, although the embodiment of the disclosure will not be limited thereto. Both the second electrode 123 and the third electrode 125 are semi-transmitting electrodes, so the second electrode 123 and the third electrode 125 to be fabricated may be made of the same material. For example, the second electrode 123 and the third electrode 125 may be fabricated in the form of thin metal layers, and preferably the thicknesses of the second electrode 123 and the third electrode 125 may be set in the range of 10 nm to 23 nm.

Figure 5:
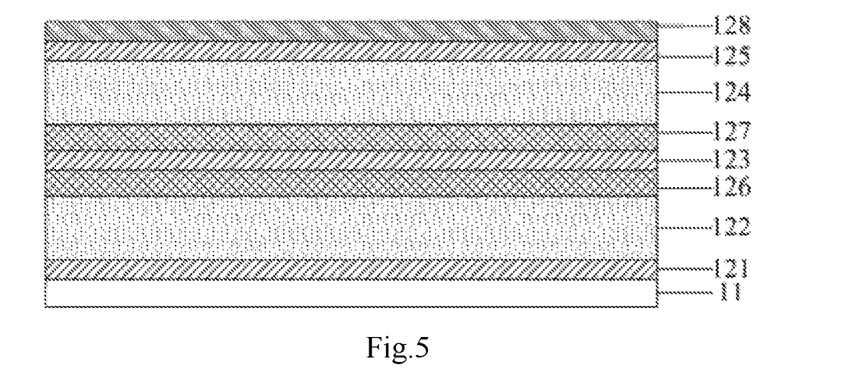
FIG. 5 is the ninth schematic structural diagram of a light-emitting element according to an embodiment of the disclosure.

When the organic light-emitting display panel above according to the embodiment of the disclosure, operates in the top-emitting mode, in order to improve the efficiency of light exiting, the first electrode 121 above is typically made of metal with a high reflectivity, and in order for the light to exit, the top third electrode 125 may be typically fabricated as a semi-transmitting electrode, but in a real application, the third electrode 125 may still be somewhat reflective, thus resulting in a micro-cavity effect in the display element. Thus in order to alleviate the micro-cavity effect, in the embodiment of the disclosure, as illustrated in FIG. 5 which is a schematic structural diagram of another light-emitting element according to an embodiment of the disclosure, a de-coupling layer 128 may be further arranged on the side of the third electrode 125 above away from the second light-emitting layer to thereby improve the stability of the display panel. In a specific implementation, the de-coupling layer 128 may be made of a material with a higher refractive index than 1.3, which may be deposited at a thickness set in the range of 300 nm to 800 nm.

Figure 6:
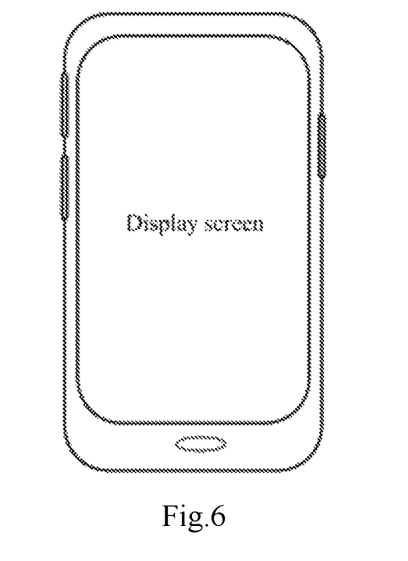
FIG. 6 is a schematic structural diagram of a display device according to an embodiment of the disclosure.

Based upon the same inventive idea, an embodiment of the disclosure further provides a display device including the organic light-emitting display panel according to any one of the embodiments above of the disclosure, and color filters located on the light exit side of the organic light-emitting display panel. The display device may be an OLED panel, an OLED display, an OLED TV set, an electronic paper, or another display device, or may be a mobile phone, a smart phone, or another mobile device. FIG. 6 illustrates a top view of the display device according to the embodiment of the disclosure, which is a smart phone, the display device may include a display screen structured as the organic light-emitting display panel according to the embodiments above of the disclosure, although the embodiment of the disclosure will not be limited thereto. In the display device above according to the embodiment of the disclosure, the potentials of the first electrode, the second electrode, and the third electrodes may be varied as needed for real color temperature to thereby adjust the color temperature of the display device.

Furthermore since ocular cells of human eyes become less active in a band including a blue peak of 460 nm to 500 nm after they are directly irradiated at a higher luminosity than 1500lx for more than three hours, the display device above according to the embodiment of the disclosure may operate as a lighting device, so that both the intensity of exiting blue light, and the color temperature of exiting light may be adjusted, and also the eyesight of a watcher may be protected. In a specific application, the display device may be switched between a display mode and an eye protection mode as needed.

In another aspect, an embodiment of the disclosure further provides a method for adjusting color temperature of the organic light-emitting display panel above, where the method may include the following operations.

The potentials of the first electrode, the second electrode, and the third electrode are adjusted according to color temperature as currently required of the organic light-emitting display panel to control the voltage applied across the first light-emitting layer, and the voltage applied across the second light-emitting layer respectively so as to control intensity of emitted light from the first light-emitting layer and the second light-emitting layer respectively, thus making the color temperature of the organic light-emitting display panel satisfactory.

When it is decided to increase the value of color temperature of the organic light-emitting display panel, the potentials of the first electrode, the second electrode, and the third electrode are adjusted to control the voltage applied across the first light-emitting layer to drop, and the voltage applied across the second light-emitting layer to raise, so as to lower the intensity of emitted light from the first light-emitting layer, and enhance the intensity of emitted light the second light-emitting layer.

When it is decided to decrease the value of color temperature of the organic light-emitting display panel, the potentials of the first electrode, the second electrode, and the third electrode are adjusted to control the voltage applied across the first light-emitting layer to raise, and the voltage applied across the second light-emitting layer to drop, so as to enhance the intensity of emitted light from the first light-emitting layer, and lower the intensity of emitted light the second light-emitting layer.

In the field of display technologies, the color temperature is the mostly common index representing the spectrum quality of emitted light from a display panel. Generally if there is more red radiation, then the color temperature of the display panel will typically be referred to as "warm" color temperature; and after the color temperature is raised, the proportion of blue radiation in the energy distribution is increased so that the color temperature of the display panel is typically referred to as "cold" color temperature. If there is a higher value of color temperature, then there will be a colder hue of the display panel. Accordingly in the embodiment of the disclosure, the potentials of the first electrode, the second electrode, and the third electrode may be controlled to control the voltage applied across the first light-emitting layer, and the voltage applied across the second light-emitting layer respectively so as to control the intensity of emitted light from the first light-emitting layer and the second light-emitting layer respectively, so that the proportion of the red (or blue) light in the overall energy distribution may be adjusted for the purpose of adjusting the color temperature.

Figure 7:
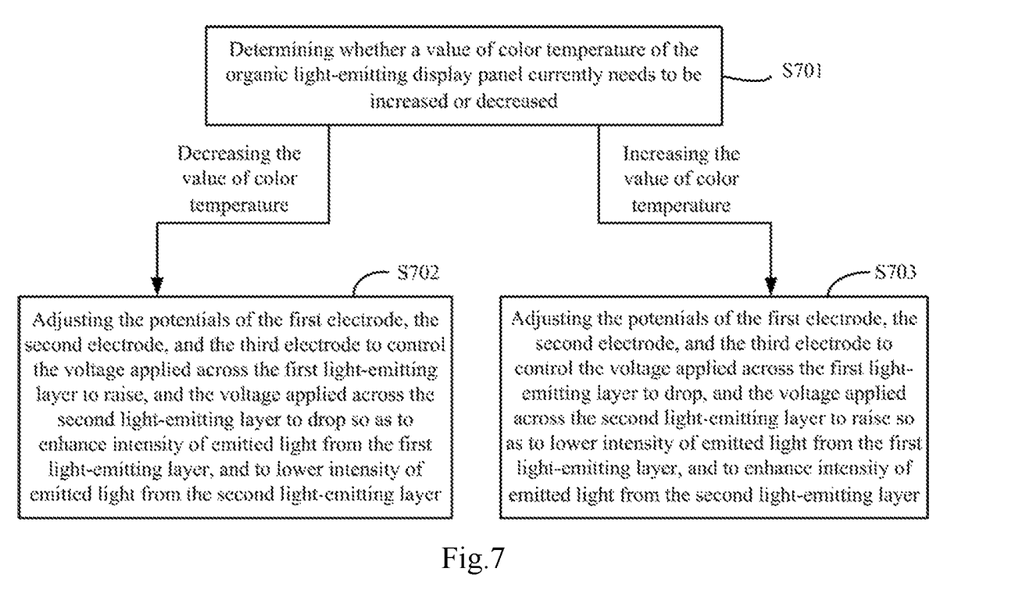
FIG. 7 is the first flow chart of a method for adjusting color temperature of an organic light-emitting display panel according to an embodiment of the disclosure.

In a specific implementation, the color temperature of the organic light-emitting display panel may be adjusted as in the flow chart of adjusting color temperature as illustrated in FIG. 7, which includes the following operations.

S701: determining whether a value of color temperature of the organic light-emitting display panel currently needs to be increased or decreased; and when it is determined that the value of color temperature of the organic light-emitting display panel currently needs to be decreased, proceeding to the operation S702; or when it is determined that the value of color temperature of the organic light-emitting display panel currently needs to be increased, proceeding to the operation S703.

S702: adjusting the potentials of the first electrode, the second electrode, and the third electrode to control the voltage applied across the first light-emitting layer to raise, and the voltage applied across the second light-emitting layer to drop so as to enhance intensity of emitted light from the first light-emitting layer, and to lower intensity of emitted light from the second light-emitting layer.

S703: adjusting the potentials of the first electrode, the second electrode, and the third electrode to control the voltage applied across the first light-emitting layer to drop, and the voltage applied across the second light-emitting layer to raise so as to lower intensity of emitted light from the first light-emitting layer, and to enhance intensity of emitted light from the second light-emitting layer.

Figure 8:
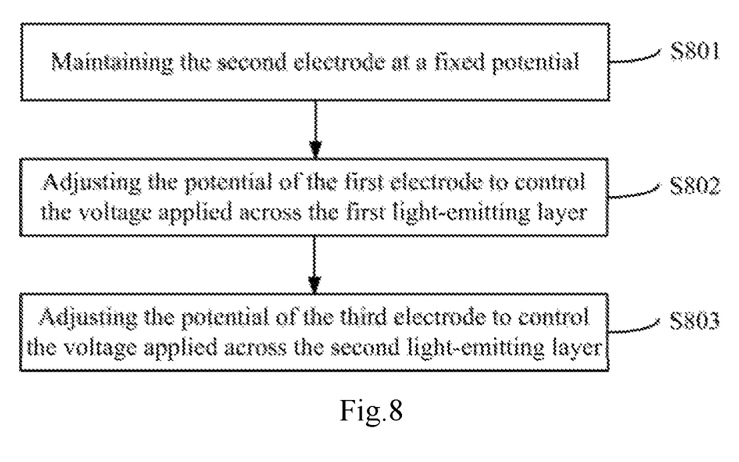
FIG. 8 is the second flow chart of a method for adjusting color temperature of an organic light-emitting display panel according to an embodiment of the disclosure.

In the flow chart of adjusting color temperature of an organic light-emitting display panel according to the embodiment of the disclosure as illustrated in FIG. 8, the potentials of the first electrode, the second electrode, and the third electrode may be adjusted to control the voltage applied across the first light-emitting layer, and the voltage applied across the second light-emitting layer respectively in the operation above, which includes the following operations.

S801: maintaining the second electrode at a fixed potential.

S802: adjusting the potential of the first electrode to control the voltage applied across the first light-emitting layer.

S803: adjusting the potential of the third electrode to control the voltage applied across the second light-emitting layer.

The potential of the second electrode is set at the fixed potential, and only the potentials of the first electrode and the second electrode will be adjusted to thereby adjust the voltage applied across the first light-emitting layer, and the voltage applied across the second light-emitting layer respectively, thus simplifying the operations as compared with the implementation in which all the potentials of the three electrodes are adjusted. In a real application, alternatively all the potentials of the first electrode, the second electrode, and the third electrode may be adjusted at the same time to thereby adjust the intensity of emitted light from the two light-emitting layers, although the embodiment of the disclosure will not be limited thereto.

In a specific implementation, the second electrode may be maintained at the fixed potential in the operation S801 above as follows.

The second electrode is grounded, and the potential of the second electrode is maintained at zero or a negative potential.

As an alternative to this, the potential of the second electrode may alternatively be maintained at another fixed potential, although the embodiment of the disclosure will not be limited thereto.

In the organic light-emitting display panel, the method for adjusting color temperature thereof, and the display device according to the embodiments of the disclosure, the organic light-emitting display panel includes: an underlying substrate, and a plurality of light-emitting elements arranged on the underlying substrate. Where each of the light-emitting elements includes a first electrode, a first light-emitting layer, a second electrode, a second light-emitting layer, and a third electrode arranged on the underlying substrate in that order in a light exit direction of the organic light-emitting display panel. Where a wavelength of emitted light from the first light-emitting layer is greater than a wavelength of emitted light from the second light-emitting layer; the first electrode, the second electrode, and the third electrode are connected respectively with different voltage signal terminals. Since the first electrode, the second electrode, and the third electrode are connected respectively with the different voltage signal terminals, the potentials of the first electrode, the second electrode, and the third electrode may be adjusted according to color temperature as required of the organic light-emitting display panel to control the voltage applied across the first light-emitting layer, and the voltage applied across the second light-emitting layer respectively, so as to control intensity of emitted light from the first light-emitting layer and the second light-emitting layer respectively, thus varying the color temperature of the organic light-emitting display panel.

Although the preferred embodiments of the disclosure have been described, those skilled in the art benefiting from the underlying inventive concept can make additional modifications and variations to these embodiments. Therefore, the appended claims are intended to be construed as encompassing the preferred embodiments and all the modifications and variations coming into the scope of the disclosure.

Evidently those skilled in the art can make various modifications and variations to the disclosure without departing from the scope of the disclosure. Thus the disclosure is also intended to encompass these modifications and variations thereto so long as the modifications and variations come into the scope of the claims appended to the disclosure and their equivalents.

The invention claimed is:

1. An organic light-emitting display panel, comprising: an underlying substrate, and a plurality of light-emitting elements arranged on the underlying substrate,
    wherein each of plurality of the light-emitting elements comprises a first electrode, a first light-emitting layer, a second electrode, a second light-emitting layer, and a third electrode arranged on the underlying substrate in an order of a light exit direction of the organic light-emitting display panel; and
    wherein a wavelength of emitted light from the first light-emitting layer is greater than a wavelength of emitted light from the second light-emitting layer;
    wherein electric potentials are applied to the first, the third electrodes respectively, wherein a ground potential is applied to the second electrode;
    wherein the plurality of light-emitting elements further comprises:
    a first buffer layer located between the first light-emitting layer and the second electrode, and a second buffer layer located between the second electrode and the second light-emitting layer;
    wherein a potential of the first electrode is higher than a potential of the second electrode, and the potential of the second electrode is higher than a potential of the third electrode;
    wherein the first buffer layer is an N-type buffer layer which is an electron carrier injection layer, and the second buffer layer is a P-type buffer layer which is a hole carrier injection layer;
    wherein the second electrode comprises a first sub-electrode and a second sub-electrode arranged in a stack, wherein the first sub-electrode is proximate to the N-type buffer layer, and the second sub-electrode is proximate to the P-type buffer layer;
    wherein a work function of the first sub-electrode is lower than a work function of the second sub-electrode;
    wherein a Lowest Unoccupied Molecular Orbital (LUMO) of the N-type buffer layer is 1.5 eV, and a Highest Unoccupied Molecular Orbital (HUMO) of the P-type buffer layer is 5.6 eV, and wherein a work function of the second electrode ranges from 3.5 eV to 5.5 eV;
    wherein an electron mobility of the N-type buffer layer is greater than $10^{-5}$ cm$^2$V/s,
    wherein the first electrode is a total reflection electrode, and the second electrode and the third electrode are semi-transmitting electrodes; and
    wherein a de-coupling layer is arranged on a side of the third electrode away from the second light-emitting layer, wherein the de-coupling layer has a refractive index greater than 1.3.

2. The organic light-emitting display panel according to claim 1, wherein the first light-emitting layer comprises: a first light-emitting sub-layer and a second light-emitting sub-layer arranged in a stack on the first electrode in the light exit direction of the organic light-emitting display panel; and
    a wavelength of emitted light from the first light-emitting sub-layer is greater than a wavelength of emitted light from the second light-emitting sub-layer.

3. The organic light-emitting display panel according to claim 2, wherein emitted light from the first light-emitting sub-layer is a red light, emitted light from the second light-emitting sub-layer is a green light, and emitted light from the second light-emitting layer is a blue light.

4. The organic light-emitting display panel according to claim 1, wherein the first light-emitting sub-layer, the second light-emitting sub-layer, and the second light-emitting layer are structured in single layers, or stacks of layers.

5. A display device, comprising the organic light-emitting display panel according to claim 1, and color filters arranged on a light exit side of the organic light-emitting display panel.

* * * * *